United States Patent

Smith, III

Patent Number: 4,775,647
Date of Patent: Oct. 4, 1988

[54] SEALING GLASS COMPOSITE

[75] Inventor: Edward F. Smith, III, Madison, Conn.

[73] Assignee: Olin Corporation, New Haven, Conn.

[21] Appl. No.: 27,069

[22] Filed: Mar. 17, 1987

Related U.S. Application Data

[63] Continuation of Ser. No. 888,316, Jul. 22, 1986, abandoned, which is a continuation of Ser. No. 651,984, Sep. 19, 1984, abandoned.

[51] Int. Cl.$^4$ .......................... C03C 8/24; C03C 8/14; C03C 14/00
[52] U.S. Cl. ........................................ 501/15; 501/17; 501/32
[58] Field of Search ............................. 511/15, 17, 32

[56] References Cited

U.S. PATENT DOCUMENTS

| | | |
|---|---|---|
| 3,446,695 | 10/1966 | Janakirama-Rao . |
| 3,676,292 | 7/1972 | Pryor et al. . |
| 3,698,964 | 8/1968 | Caule et al. . |
| 3,726,987 | 4/1973 | Pryor et al. ................. 174/50.61 |
| 3,730,779 | 8/1970 | Caule et al. . |
| 3,810,754 | 3/1973 | Ford et al. . |
| 3,841,883 | 10/1974 | Sherk et al. . |
| 3,873,330 | 3/1975 | Sherk et al. . |
| 3,904,426 | 9/1975 | Frieser et al. . |
| 3,954,486 | 5/1976 | Francel et al. . |
| 3,963,505 | 6/1976 | Dumesnil ................. 501/15 |
| 4,004,936 | 1/1977 | Powell . |
| 4,149,910 | 4/1979 | Popplewell ................. 148/6.35 |
| 4,172,919 | 10/1979 | Mitchell . |
| 4,185,139 | 1/1980 | Smernos ................. 428/404 |
| 4,186,023 | 1/1980 | Dumesnil et al. . |
| 4,405,722 | 9/1983 | Kokuba et al. ................. 501/15 |
| 4,410,927 | 10/1983 | Butt ................. 361/386 |
| 4,434,016 | 2/1984 | Saleh et al. . |
| 4,461,924 | 7/1984 | Butt ................. 174/52 FP |
| 4,480,262 | 10/1984 | Butt ................. 357/74 |
| 4,491,622 | 1/1985 | Butt ................. 428/632 |
| 4,521,469 | 6/1985 | Butt et al. ................. 428/35 |
| 4,524,238 | 6/1985 | Butt ................. 357/74 |
| 4,525,422 | 6/1985 | Butt et al. ................. 428/418 |
| 4,532,222 | 7/1985 | Butt ................. 501/32 |
| 4,542,259 | 9/1985 | Butt ................. 174/52 FP |
| 4,569,692 | 2/1986 | Butt ................. 75/235 |
| 4,570,337 | 2/1986 | Butt ................. 29/840 |
| 4,577,056 | 3/1986 | Butt ................. 174/52 FP |
| 4,594,770 | 6/1986 | Butt ................. 29/588 |
| 4,607,276 | 8/1986 | Butt ................. 357/79 |

FOREIGN PATENT DOCUMENTS

| | | |
|---|---|---|
| 2700273 | 7/1978 | Fed. Rep. of Germany . |
| 159947 | 4/1983 | Fed. Rep. of Germany . |
| 1569028 | 6/1980 | United Kingdom . |

OTHER PUBLICATIONS

"Glazes and Enamels", by Richard A Eppler, *Glass Science & Technology*, vol. 1, Academic Press, NYC, N.Y. 1983, pp. 328 to 330.

"Introduction to Ceramics" by W. D. Kingery, published by John Wiley & Sons, Inc., 1967, pp. 479-480.

"Glass-Ceramics" by P. W. McMillan, Academic Press, 1979, p. 1.

Primary Examiner—Mark L. Bell
Attorney, Agent, or Firm—Gregory S. Rosenblatt; Paul Weinstein

[57] ABSTRACT

The present direct invention is directed to a sealing glass composite comprising a low melting point sealing glass matrix mixed with a particulate additive to increase the effective coefficient of thermal expansion of the resulting sealing glass composite. The sealing glass matrix is in the lead borate family and the particulate additive is preferably calcium fluoride. The glass composite is particularly useful as a semiconductor package sealant.

11 Claims, 1 Drawing Sheet

SEALING GLASS COMPOSITE

This application is a Continuation of copending application Ser. No. 888,316, filed July 22, 1986, now abandoned which in turn is a Continuation of application Ser. No. 651,984, filed Sept. 19, 1984 (now abandoned).

This application relates to U.S. patent application Ser. No. 651,987, by Edward F. Smith, III, filed Sept. 19, 1984, entitled "Sealing Glass Composite" (now abandoned).

While the present invention is subject to a wide range of applications, it is especially suited for use in glass sealing of semiconductor packages. The invention primarily relates to a low temperature sealing glass composite having an undissolved additive which increases the coefficient of thermal expansion of the composite. In a second embodiment, the sealing glass may have a copper oxide constituent which enhances the adhesion of the glass composite to a metal substrate.

In the fabrication of electronic devices, the individual integrated circuits (typically referred to as dies) are often placed in a protective package for ease of handling and protection from environmental or mechanical damage. The highest degree of environmental protection is achieved through the use of a hermetic package design. Although there is a wide variety of specific designs, hermetic packages generally require glass sealing technology to achieve the desired combination of environmental isolation coupled with electrical isolation of the individual leads. For example, in a conventional Ceramic Dual In-Line Package (CERDIP) 10, as illustrated in FIG. 1, a low temperature sealing glass 12 is used to seal a metal (typically aluminum striped alloy 42 or Kovar) lead frame 14 between ceramic substrate components 16 and 18. The resulting hermetically sealed package encloses a die 20 which is attached to substrate component 18 and electrically connected by wires 22 to lead frame 14. In order for these glass to metal and glass to ceramic bonds to remain both mechanically stable and hermetic, it is desirable that all the components have matched thermal expansion properties. Typical values for coefficients of thermal expansion for metal and ceramic materials of interest in electronic packaging are set out in Table II.

In general, the glasses used for package fabrication are complex lead borate, lead zinc borate, lead borosilicate or lead-zinc borosilicate glasses whose physical and electrical properties are matched to needs of the electronics industry. These glasses generally include PbO in the range of 75-85%, $B_2O_3$ levels between 5-15% and a ZnO addition between 0-5%. The remaining 5-10% of the glass constituents are selected to provide the desired sealing characteristics, corrosion resistance, electrical resistivity, dielectric constant, etc. The glasses in this composition range generally have a coefficient of thermal expansion (CTE) in the range of about 80 to about $130 \times 10^{-7}$ in/in/°C. As shown in Table II, a CTE in this range is much too large to achieve a thermally matched seal with the typical CERDIP materials.

In order to overcome this potential thermal mismatch, it is generally accepted practice to add a low expansion, refractory filler to the glass. U.S. Pat. Nos. 3,954,486 to Francel et al. and 4,186,023 to Dumesnil et al. are illustrative of this concept. However, it is not generally accepted practice to use this technique in an effort to raise the overall thermal expansion coefficient, and thereby, offer the possibility of providing sealing glasses for higher expansion materials such as copper or aluminum. U.S. patent application Ser. No. 539,499 entitled "Low Thermal Expansivity and High Thermal Conductivity Substrate" to S. H. Butt discloses increasing the coefficient of thermal expansion of a composite. The application differs from the present invention because it does not relate to the general class of lead borate type glasses which form the basic glass matrix of the present invention.

The CERDIP of FIG. 1 successfully protects integrated circuits from environmental and mechanical damage. Conventionally, it is fabricated from an alumina lid and base and an aluminum striped alloy 42 lead frame. A serious drawback to this package is its relatively poor heat dissipation properties. This may be a severe limitation since state of the art chips are frequently fabricated with complex circuitry which generates a degree of heat that adversely effects the chip unless dissipated.

In an effort to overcome this dificiency, various alternative hermetic packages have been proposed. Many of these packages have attempted to utilize higher thermal conductivity metallic components to replace the ceramic base and/or lid. However, the constraint of matched coefficients of thermal expansion between the metallic substrates and the sealing glass has limited most designs of glass sealed, hermetic packages to low thermal expansion metals, such as alloy 42 or Kovar. Although these metals are thermally compatible with conventional sealing glasses, as indicated in Table II, they offer no heat dissipation advantage over alumina, and actually have a lower thermal conductivity than the 96% $Al_2O_3$ components typically used in CERDIPs.

Efforts to use higher conductivity materials to manufacture semiconductor packages requires the ability to identify a thermally and mechanically stable glass to metal sealing combination. Examples of suitable metals are copper alloys containing an effective amount of up to about 12% aluminum capable of forming a refractory oxide. U.S. Pat. No. 4,491,622 entitled "Improved Printed Circuit Board" by S. H. Butt; Ser. No. 369,785 entitled "Improved Chip Carrier" by S. H. Butt, filed Apr. 19, 1982 now abandoned; Ser. No. 390,081 entitled "Improved Semiconductor Package" by S. H. Butt, filed June 21, 1982; now U.S. Pat. No. 4,532,222 entitled "Reinforced Glass Composites" by S. H. Butt, and U.S. Pat. No. 4,410,927 entitled "Semiconductor Casing" by S. H. Butt relate to glass sealed metal packages.

The present invention has identified copper oxide as a modification to a glass formulation to improve glass to metal adhesion. As discussed in the article entitled "Glazes and Enamels" by Richard A. Eppler, pages 328 to 330, in *Glass Science & Technology*, Vol 1, Composition of Glass, Edited by N. Kriedl and D. Uhlmann, Academic Press, NYC, N.Y., 1983, the bond between porcelain enamels and metals is improved by adding easily reducible oxides such as cobalt oxide, nickel oxide and copper oxide to the enamel. However, the temperature range at which the enamel is applied to the metal is generally between about 800° C. to about 900° C. This is completely out of the range of the temperatures associated with the present invention which are generally below about 450° C. Further, both the iron oxide and nickel oxide have not been found to enhance the bonding between the glass and the metal substrates used in the present invention.

An example of a high temperature sealing glass having a copper oxide constituent is found in U.S. Pat. No. 4,172,919 to Mitchell. This patent is directed to a conductor composition consisting of at least about 86 wt. % copper and the remainder glass and copper oxide. The composition is subjected to temperatures of about 700° C. during adherence to a substrate. Both the conductor composition and the firing temperature are significantly different from that of the glass composite set forth in the present invention.

Other examples of low temperature sealing glasses having a copper oxide constituent are found in U.S. Pat. Nos. 3,446,695; 3,841,883; 3,873,330; 3,904,426; and 4,004,936. None of these patents, however, disclose that a copper oxide addition to the sealing glass improves bonding to a metal substrate.

In accordance with the present invention, a unique, lead borate type, low melting point solder glass with an additive such as calcium fluoride has been found to successfully bond together metal, semiconductor casing components. In spite of the successful bond between the components, there still exists a desire to further improve the glass to metal adhesion so as to enhance the thermally and mechanically stable glass to metal sealing combination.

It is a problem underlying the present invention to provide a high expansivity, low melting point glass composite which forms a thermally and mechanically stable glass to metal seal.

It is an advantage of the present invention to provide a sealing glass composite which obviates one or more of the limitations and disadvantages of the described prior arrangements.

It is a yet further advantage of the present invention to provide a sealing glass composite having a component which increases the thermal expansion characteristics of the composition.

It is a yet further advantage of the present invention to provide a sealing glass composite which forms a thermally and mechanically stable glass to metal seal.

It is a still further advantage of the present invention to provide a sealing glass composite which is relatively inexpensive to manufacture.

Accordingly, there has been provided a sealing glass composite comprising a low melting point sealing glass matrix with a relatively insoluble particulate additive to increase the effective coefficient of thermal expansion of the resulting sealing glass composite. The glass matrix is preferably in the lead borate family and the additive is preferably calcium fluoride. The composite is particularly useful as a semiconductor package sealant. A soluble additive may also be added to the sealing glass matrix to improve the adhesion of the glass to a metal substrate under extreme operating conditions.

The invention and further developments of the invention are now elucidated by means of the preferred embodiments in the drawings.

Figure 1:
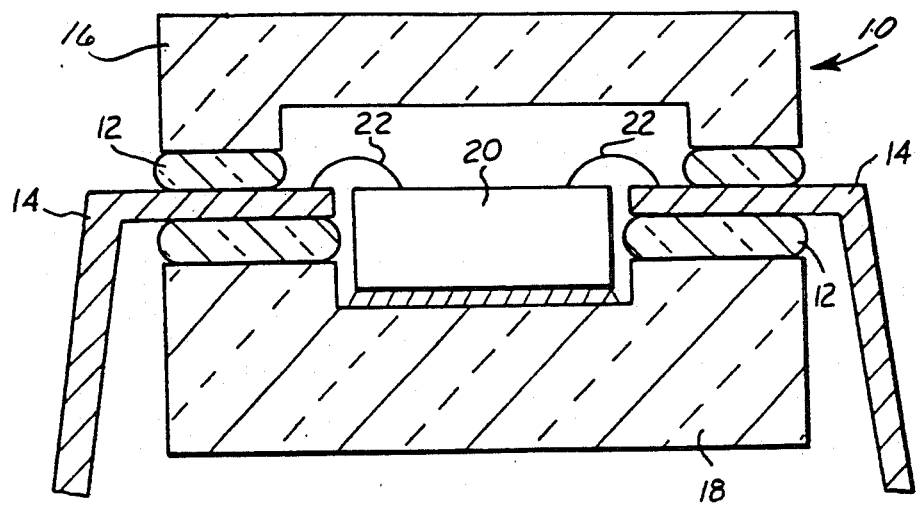
FIG. 1 is a cross-sectional view of a prior art ceramic dual-in-line package.

The present invention sets forth a unique sealing glass composite wherein the matrix comprises a low melting point sealing glass selected from the group consisting of lead borate, lead-zinc borate, lead borosilicate or lead-zinc borosilicate glasses. An additive of a particulate filler which is insoluble or only slightly soluble in the sealing glass matrix is added to increase the effective coefficient of thermal expansion of the resulting glass composite.

The glass matrix of the sealing glass composite of the invention is preferably a complex lead borate type glass matrix generally also containing one or more other glass components, such as bismuth, zinc, aluminum, silicon, barium, arsenic, tin, and tellurium which are normally present in their respective oxide forms. These lead borate type solder glasses usually have a coefficients of thermal expansion of about $80 \times 10^{-7}$ to about $130 \times 10^{-7}$ in/in/°C. over the temperature range from ambient to their glass transition temperatures (typically about 300° C.).

Such glasses are used in forming vitreous seals and glass-ceramic or semicrystalline seals as known in the electronic packaging art. Weight percent compositional ranges are set forth below in Table I where the total content of all oxides is 100 percent.

TABLE I

| Oxide | Broad Range (wt. %) | Preferred Range (wt. %) |
|---|---|---|
| PbO | 70–85 | 75–85 |
| ZnO | 0–20 | 0.5–16 |
| $B_2O_3$ | 5–15 | 8–15 |
| $SiO_2$ | 0–10 | 0–5 |
| BaO | 0–3 | 0–2 |
| $SnO_2$ | 0–5 | 0–2 |

Other conventional glassmaking oxides such as CaO, $Bi_2O_3$, $Na_2O$, $K_2O$, $Li_2O$, CdO, and $Fe_2O_3$ can be included. However, it is preferred in many instances not to employ these ingredients but rather to constitute the glass matrix of essentially only those ingredients set forth in Table I above.

In accordance with the present invention, the particulate additive having a high coefficient of thermal expansion as compared with the glass matrix, is preferably calcium fluoride or barium fluoride. These materials have limited solubility in the sealing glass at the temperature and times in accordance with this invention. The additive comprises particles having a size between about 1 to about 150 microns. Preferably, the particles have a size between about 10 to about 75 microns. The particle size is limited because smaller particles more readily dissolve in the glass during the sealing process and the sealing glass composite loses the benefit of the high coefficient of thermal expansion of the additive. Conversely, if the particles are too large, the glass flow between them is restrained and their exposed surfaces are prevented from being wet. The result is a loss of strength due to the formation of voids between the interfaces of the particles. The filler or additive has a maximum critical volume content of an effective amount up to about 30 wt. % (60 vol. %) of the glass matrix to prevent particle interlock. Preferably, the filler in the glass matrix is between about 10 to about 20 wt. % (40 to about 60 vol. %) for application to a copper or copper alloy substrate. The filler in the glass matrix has a coefficient of thermal expansion (CTE) which is higher than the CTE of the glass. More importantly, the CTE of the filler must be higher than that of the metal substrate to which it is bonded in order that the CTE of the glass composite can approximate that of the substrate.

The calcium fluoride filler may be supplied as either a man-made, synthetic powder or as fluorspar, the naturally occuring mineral version of the compound. The filler is mixed with powdered sealing glass sized to pass through about 200 mesh or less and preferably through about 400 mesh or less. The sealing glass typically is used to seal packages at a temperature between about 400° C. to about 450° C. The calcium fluoride additive remains inert but wettable at those temperatures. It is a critical aspect of the present invention that the filler is substantially insoluble in the glass matrix at the operative times and temperatures associated with the invention so that the particles remain intact and are not dissolved into the glass. Although it is desirable for a minimum amount of filler to dissolve in the matrix, it is within the scope of the present invention for a maximum of less than about 10 wt. % of the particulate additive to dissolve into the glass. The limited solubility requirement is because the observed increase in thermal expansion arises from a physical mixture of glass and filler, not a modification of the basic glass chemistry.

Fluorspar has a CTE in excess of about $220 \times 10^{-7}$ in/in/°C. By contrast, the CTE of materials generally used in electronic packaging is significantly lower as indicated in Table II hereinbelow.

TABLE II
LINEAR COEFFICIENT OF THERMAL EXPANSION (CTE) FOR A VARIETY OF MATERIALS USED IN ELECTRONIC PACKAGING

| MATERIAL | CTE ($\times 10^{-7}$ in/in/°C.) |
| --- | --- |
| Copper (Cu) | 173 |
| Cu Alloy C19500 | 169 |
| Copper, annealed | 168 |
| Cu Alloy C19400 | 163 |
| Cu Alloy C63800 | 171 |
| *Sealing Glasses | 50–90 |
| Alumina thick film substrate | 65 |
| Leadless chip carrier | 65 |
| Alumina cofired substrate | 64 |
| 99.55 BeO | 64 |
| Copper clad Invar | 64 |
| Thick Film Substrate | 64 |
| *96% Alumina | 64 |
| *94% Alumina | 64 |
| *Kovar | 62 |
| *Alloy 42 | 58 |

*used in CERDIP fabrication

Table III lists measured values of CTE for two glasses (PP-200 from Owens Illinois Corp. of Toldeo, Ohio and T-176 from Asahi Corp. of Japan) as a function of $CaF_2$ loading. The glass composite preferably has a CTE of above about $138 \times 10^{-7}$ in/in/°C. (from ambient to glass transition temperature). Table IV below lists the estimated glass composition by weight percent of these glasses. These samples were prepared from a physical mixture of the glass powder and $CaF_2$ powder which was then heated to a temperature typical of CERDIP sealing (about 430° C. for about 10 minutes). Under these conditions, there is sufficient glass flow to allow complete wetting of the $CaF_2$ particles, without significant dissolution of the $CaF_2$ into the glass. The glass characteristically achieves the critical requirement that the filler particles remain intact and are not substantially dissolved into the glass.

TABLE III
THERMAL EXPANSION MEASUREMENTS FOR GLASS-FILLER MIXTURES

| Glass | Expansivity ($\times 10^{-7}$ in/in/°C.) 20–300° C. |
| --- | --- |
| PP-200* | 117 |
| PP-200/15% WT. Fluorspar | 151 |
| PP-200/20% WT. Fluorspar | 158 |
| Asahi T-176** | 115 |
| T-176/10% WT. Fluorspar | 138 |
| T-176/15% WT. Fluorspar | 147 |
| T-176/20% WT. Fluorspar | 156 |

*Proprietary glass from the Owens Illinois Corp. of Toledo, Ohio.
**Proprietary glass from the Asahi Glass Corp. of Japan.

TABLE IV
ESTIMATED GLASS COMPOSITIONS BY WEIGHT PERCENT

| | PbO | $B_2O_3$ | ZnO | $SiO_2$ | $SnO_2$ | $Bi_2O_3$ | BaO |
| --- | --- | --- | --- | --- | --- | --- | --- |
| T-176* | 83.2 | 11.7 | 4.1 | .55 | .3 | | |
| PP-200** | 82.8 | 11.7 | 1.0 | .5 | | 3.5 | .5 |

*Proprietary glass from the Asahi Corp.
**Proprietary glass from the Owens Illinois Corp.

To demonstrate the advantage of thermally matched materials, samples of glass to metal seals were produced and tested for torque strength. The samples were fabricated from two ¼"×¾" flat substrates of Cu alloy (either C63800 or a Cu-Ni-Al alloy (B-27) that were sealed together with a glass (Asahi T-176) layer. The various formulations of the glass composite used in conjunction with these tests as well as others described below are set out in Table V.

TABLE V
GLASS FORMULATIONS

| Sample | Glass | Additions | |
| --- | --- | --- | --- |
| | | $CaF_2$ (wt. %) | CuO (wt. %) |
| A | T-176* | 0 | 0 |
| B | T-176* | 15 | 0 |
| C | T-176* | 20 | 0 |
| D | T-176* | 0 | 1.4 |
| E | T-176* | 15 | 1.4 |
| F | T-176* | 15 | 2 |
| G | T-176* | 20 | 1.4 |

*Proprietary glass from the Asahi Corp.

Data supporting the advantage of matching the coefficients of thermal expansion between the glass composite and the metal substrates by increasing the CTE of the glass composite by additives such as $CaF_2$ is illustrated in Table VI. Without the $CaF_2$ addition, stable mechanical bonding was not achieved. In the test samples of metal substrates being sealed together by T-176 without any additions, the glass cracked upon cooling from the initial sealing temperature of about 430° C. By adding 20 wt. % fluorspar to the T-176 glass, stable bonds between the metal substrates and the resulting glass composite were formed as indicated by torque strengths in the range of about 20 to about 40 in. lb. The glass samples correspond to those identified in Table V.

TABLE VI
TORQUE STRENGTH OF METAL SUBSTRATE-GLASS COMPOSITE-METAL SUBSTRATE
(using the Asahi T-176 glass)

| Metal Substrate | Glass Sample | Torque Strength (in.lb.) range | Avg. |
|---|---|---|---|
| Alloy C63800 | A | 0 | 0 |
| Alloy C63800 | C | 20–30 | 27 |
| Cu—Ni—Al alloy (B-27) | A | 0 | 0 |
| Cu—Ni—Al alloy (B-27) | C | 35–40 | 37 |

The importance of limiting particle dissolution is demonstrated by comparing results for PbF$_2$ and CaF$_2$ particles added to lead borate type glass. Test data indicate that for the times and temperatures of interest in electronic package sealing (i.e. about 400° C. to about 450° C. for about 5 to about 20 minutes), the presence of up to 20 wt. % (approximately 40 volume %) CaF$_2$ does not adversely effect the important physical properties of the sealing glasses (i.e. devitrification tendency, flow, chemical resistance, etc.). However, even small amounts of PbF$_2$ (i.e. <5 volume %), which is soluble in these glasses, can produce enough of an overall chemistry change to initiate rapid devitrification of the glass during a simulated sealing cycle. After devitrification, the glass exhibits a drastic reduction in flow characteristics, and as such would not allow the typical two step sealing operation for CERDIP assembly (i.e. embedding the lead frame into a glass layer covering the surface of the base member; followed by glass sealing the cover onto the lead frame).

Therefore, it is an important aspect of the present invention for the high expansivity, particulate additive to have limited solubility in the glass matrix for the time and/or temperature levels typical of the intended sealing cycles. The particulate is preferably added to the glass when the latter is in powder form. The glass is then melted at a selected temperature whereby the particulate remains intact and does not substantially dissolve into the glass. For example, the glass may be melted, cast or water quenched and milled to powder prior to the CaF$_2$ addition. The resulting composite of the CaF$_2$ particulate in a lead borate type glass matrix is distinguished from the prior art glasses such as disclosed in U.S Pat. No. 4,186,023 to Dumesnil in which fluorides are incorporated directly into the glass during the initial melting, and therefore, are not available as the high expansion second phase required to modify the overall CTE of the resulting glass composite.

BaF$_2$ is thought to be effective over approximately the same range of about 20 to about 30 wt. % BaF$_2$ by the glass.

Efforts to use higher thermal conductivity materials for semiconductor casings also require a suitable metal or alloy substrate to enhance the formation of a thermally and mechanically stable glass to metal sealing combination. It is understood that the metals selected for these packages preferably consist of a high thermal conducitivity metal or metal alloy such as for example copper or aluminum metals or alloys. The preferred metal or metal alloy of the present invention is a copper or copper base alloy capable of forming a thin refractory oxide layer on at least the surface which is bonded to the glass. An exemplary alloy contains an effective amount of up to about 12% aluminum capable of forming a refractory oxide layer and the balance copper. Preferably, the exemplary alloy consists essentially of from about 1 to 10% aluminum, 0.001 to 3% silicon and optionally, a grain refining element selected from the group consisting of iron up to 4.5%, chromium up to 1%, zirconium up to 0.5%, cobalt up to 1% and mixtures of these grain refining elements and the balance copper. In particular, CDA alloy C53800, as disclosed in U.S. Pat. No. 3,676,292 to Pryor et al., has been demonstrated as suitable. Impurities may be present in the alloy which do not significantly degrade the properties of the alloy or prevent bonding in a desired embodiment. Alloy C63800 has a CTE of about 170×10$^{-7}$ in/in/°C.

The present invention is not restricted to applications of alloy C63800 but includes the broad field of metals or alloys which have a CTE between about 110 to about 220×10$^{-7}$ in/in/°C. Preferably, the CTE would be between about 140 to about 180×10$^{-7}$ in/in/°C. A copper-nickel-aluminum alloy (called B-27 herein) which has been demonstrated to be suitable is disclosed in U.S. Pat. No. 4,434,016 to Saleh et al. The alloy consists essentially of form about 10% to about 15% nickel, from about 1% to about 3% aluminum, up to about 1% manganese, from about 0.05% to less than about 0.5% magnesium and the balance copper. Silicon should not exceed about 0.05%, lead should be less than about 0.015% and phosphorous should be less than about 0.005%. B-27 has a CTE of about 170×10$^{-7}$ in/in/°C. Other examples of suitable metal alloys, such as nickel base and iron base alloys, are disclosed in U.S. Pat. Nos. 3,698,964, 3,730,779 and 3,810,754.

Metals of the above described composition range have been found to form a satisfactory glass seal with a lead borate type glass sealing composite of the type described hereinabove. The glass composite is preferably a mixture of a low melting point, lead borate type glass matrix and a substantially insoluble, high thermal expansion additive such as calcium fluoride or barium fluoride. The need for the additive has been demonstrated with the data of Table VI. A lead borate type glass lacking a filler (Example A of Table V) which is sealed between metal substates of either C63800 or B-27 does not form a seal which can sustain any significant torque. However, a lead borate type glass composite including an additive such as CaF$_2$ (Example C of Table V) which is sealed between metal substrates of either C63800 or B-27 does form a seal which can withstand a significant torque before seal failure.

Figure 2:
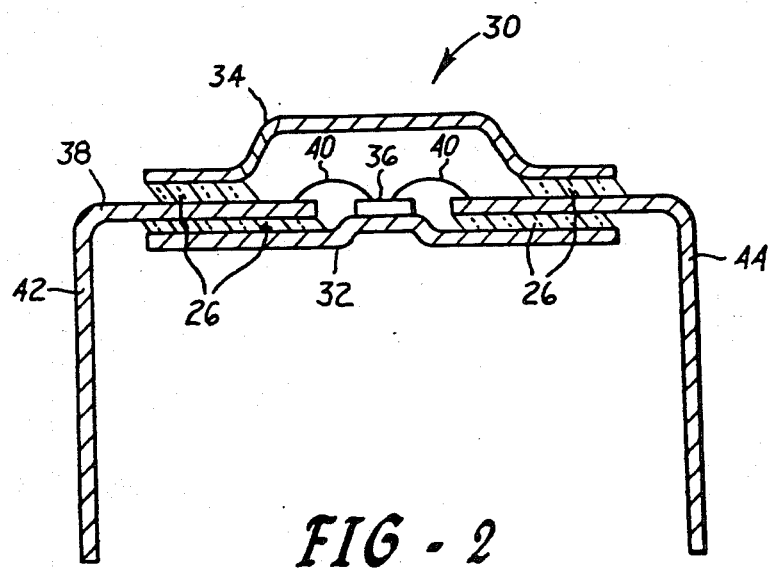
FIG. 2 is a cross-sectional view through a metal quad-in-line package incorporating the sealing glass composite of the present invention.
Figure 3:
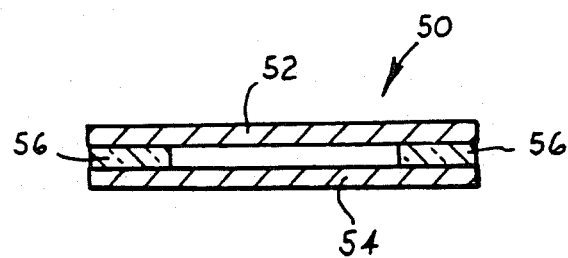
FIG. 3 is a cross-sectional view of a test package in accordance with the present invention.

When the packages of FIGS. 2 and 3 are subjected to extremely adverse conditions such as thermal shock, even the addition of CaF$_2$ to the glass was not ideal with respect to providing a strong bond between the glass composite and the metal substrates which could withstand the hermeticity and mechanical integrity testing described hereinbelow.

The present invention addresses to the need for an improved glass composite which can withstand extreme operating conditions by further modification of lead borate type glass composite described above with low levels of copper oxide (CuO). This was demonstrated with glass sample E of Table V where 2 wt. % CuCO$_3$ (the equivalent of 1.4 wt. % CuO) was added to the Asahi T-176 glass and the modified composition was remelted according to conventional practice. After remelting, the glass was water quenched, dryed, ball milled, and seived to a particle size of about 200 mesh or less. Then the glass was physically mixed with about 15 wt. % fluorspar powder (CaF$_2$) also having a particle size of about 200 mesh or less.

Testing of the seal between the copper oxide modified glass composite and the metal alloys described above was performed on both Dual-In-Line Packages of the type shown in FIG. 2 and on single sandwich type packages of the type illustrated in FIG. 3. The test package 30, of FIG. 2, includes a metal base member 32. A metal housing member 34 shaped to provide a hollow enclosure for receiving an electronic component 36 is mounted upon the base member. A metal alloy lead frame 38 is glass sealed between the base member and the housing member. The lead frame is connected by wires 40 to an electronic chip component 36 prior to the final sealing of the package. The lead frame 38 has terminal leads 42 and 44 projecting between the base and the housing member external to the casing 30. The terminal leads are sealed and bonded between the base member and the housing member to hermetically seal the casing. The sandwich package 50 of FIG. 3 includes two metal substrate components 52 and 54 bonded together by a sealing glass 56 in accordance with the present invention. The sealing glass for these two types of packages was a lead borate type sealing glass of varied formulation within the ranges specified hereinabove.

Evaluation of the package samples was based on two criteria: (1) hermeticity and (2) mechanical integrity. Hermeticity was measured according to Mil Spec 883B using a helium leak detector. The acceptable standard for this test required each sample to have a helium leak rate below $5 \times 10^{-8}$ cm$^3$/sec. The acceptable leak rate should be maintained both before and after thermal shock (T.S.) testing (10 cycles, liquid to liquid, $-65°$ C. to $+150°$ C.). These tests were conducted on both sample configurations 30 and 50. (See Table VII and VIII) The mechanical integrity of the sealed package 30 was assessed by the ability of the package to sustain at least 3 cycles of a 90° lead bend without mechanical damage. The choice of 3 bends is arbitrary and not based on a known standard.

In Table VII below, the hermeticity test results of metal packages sealed with glass samples D, E, and G of Table V is set forth. The testing was performed on Dual-In-Line packages as shown in FIG. 2. The base and lid of these packages were fabricated from B-27 and the lead frame from C63800. As might be expected from the test data of Table VI, an alloy base and lid sealed with a glass seal using a lead borate type glass modified with CuO but without a glass filler (sample D), fails to stand up to the hermeticity testing because of the CTE mismatch between the glass and the alloy substrates. The packages cracked while cooling from the sealing temperature of 430° C. When the sample E glass (including both CaF$_2$ and CuO) was used to seal a Dual-In-Line package, of the type shown in FIG. 2, hermeticity was maintained both before and after exposure to thermal shock. Finally, sample G was used to seal Dual-In-Line packages. The test results indicate that the 20 wt. % fluorspar addition had reached a level where the hermeticity was poor. In actual practice, the amount of fluorspar addition relates to the specific glass composition. For example, if the glass is more vitreous, an effective sealing composition may be composed of a greater percentage of fluorspar than if the glass is less vitreous. Accordingly, the maximum CaF$_2$ addition is determined in accordance with the specific glass composition to which it is added.

TABLE VII

HERMETICITY TESTING WITH THE 1.4 WT. % CuO MODIFIED ASAHI T-176 GLASS SEALING A DUAL-IN-LINE PACKAGE OF FIG. 2

| Glass Sample | Hermeticity Before T.S. | Hermeticity After T.S. |
|---|---|---|
| D | 0% pass (cracked on cooling) | — |
| E | 100% pass | 100% pass |
| G | 20% pass | 0% pass |

In Table VIII below, the test results of the sandwich type package illustrated in FIG. 3 are set forth. The metal substrates were fabricated from C36800 and B-27 and sealed together with the lead borate type glass composite of sample F (Asahi T-176 and having 15 wt. % fluorspar filler) modified by 2 wt. % copper oxide. The test data indicates that this glass did not provide a strong enough bond to the metal substrates to withstand thermal shock.

TABLE VIII

HERMETICITY TESTING ON SANDWICH SAMPLES USING SAMPLE F (T-176* WITH 2.0 WT. % CuO AND 15 WT. % FLUORSPAR FILLER)

| Metal | Samples | Hermeticity Before T.S. | Hermeticity After T.S. |
|---|---|---|---|
| C63800 | 5 | 100% pass | fail |
| B-27 | 5 | 100% pass | fail |

*Proprietary glass of the Asahi Co.

Taking the data of Tables VI and VIII together, the desirability of copper oxide (CUO) addition to the glass has been established as being an effective amount of up to about 2 wt. % for forming a strong enough glass to metal bond having improved capability for withstanding thermal shock. Preferably, the CuO addition to the glass is within the range of about 0.1 to about 2 wt. %.

As set forth in Table IX below, an additional test was performed on a package of the type illustrated in FIG. 1 wherein the cover 34 and the base 32 are fabricated from C63800 while the lead frame 38 is fabricated from B-27. When the sample B glass (T-176 having 15 wt. % fluorspar but no copper oxide) was used to seal the package, a failure between the glass and the metal interface occured before the completion of one bend. However, when the same glass and fluorspar filler was modified by providing a copper oxide level of about 1.4 wt. %, the mechanical damage of the seal occured at both the glass-metal interface and within the glass itself after more than three cycles of a 90° lead bend.

TABLE IX

MECHANICAL INTEGRITY TEST FOR PACKAGE FABRICATED FROM A C63800 LID AND BASE, A B-27 LEAD FRAME AND SEALED WITH GLASS SAMPLES B AND E

| Glass Sample | # of bend | type of failure |
|---|---|---|
| B | <1 | interfacial |
| E | >3 | mixed |

The patents, patent applications and publication set forth in this application are intended to be incorporated by reference herein.

It is apparent that there has been provided in accordance with this invention a sealing glass composite which satisfies the objects, means, and advantages set forth hereinabove. While the invention has been described in combination with the embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

I claim:

1. A glass composite comprising:
   a first component consisting essentially of a glass matrix selected from the group consisting of lead borate, lead-zinc borate, lead borosilicate and lead-zinc borosilicate glasses, said glass matrix having a coefficient of thermal expansion in excess of about $80 \times 10^{-7}$ in./in./°C. (from ambient to glass transition temperature); and
   a second component mixed into said first component to increase the effective coefficient of thermal expansion of the resulting glass composite, said second component consisting of an effective amount up to about 30 wt. % of a particulate additive having limited solubility in said glass matrix, said particulate additive being selected from the group consisting of calcium fluoride and barium fluoride.

2. The glass composite of claim 1 wherein said particulate additive is present in said glass composite in an amount from about 10 to about 30 wt. %.

3. The glass composite of claim 2 including said particulate additive being substantially insoluble in said glass matrix.

4. The glass composite of claim 3 wherein less than about 10 wt. % of the particulate additive mixed in said glass matrix is soluble in said glass matrix.

5. The glass composite of claim 4 wherein said glass composite has a coefficient of thermal expansion of above about $138 \times 10^{-7}$ in./in./°C. (from ambient to glass transition temperature).

6. The glass composite of claim 5 wherein said glass matrix consists essentially of by weight about 70 to about 85% PbO, up to about 20% ZnO, between about 5 to about 15% $B_2O_3$, up to about 10% $SiO_2$, up to about 3% BaO and up to about 5% $SnO_2$.

7. The glass composite of claim 5 wherein said glass composite is a sealing glass.

8. The glass composite of claim 1 wherein said particulate is sized from about 10 to about 150 microns.

9. The glass composite of claim 8 wherein said particulate is sized from about 40 to about 150 microns.

10. The glass composite of claim 9 wherein said composite has a sealing temperature about 400° C.

11. The glass composite of claim 10 wherein said glass composite has a sealing temperature from above 400° to about 450° C.

* * * * *

UNITED STATES PATENT AND TRADEMARK OFFICE
CERTIFICATE OF CORRECTION

PATENT NO. : 4,775,647

DATED : October 4, 1988

INVENTOR(S) : Edward F. Smith, III

It is certified that error appears in the above—identified patent and that said Letters Patent is hereby corrected as shown below:

Column 12, line 25, after "said" please insert ---glass---

Column 12, line 26, delete "about" and insert ---above--- in its place

Signed and Sealed this

Tenth Day of December, 1991

Attest:

HARRY F. MANBECK, JR.

Attesting Officer

Commissioner of Patents and Trademarks